United States Patent [19]

Ochii

[11] Patent Number: 5,796,137
[45] Date of Patent: *Aug. 18, 1998

[54] SEMICONDUCTOR MEMORY DEVICE HAVING CAPACITOR OF THIN FILM TRANSISTOR STRUCTURE

[75] Inventor: Kiyofumi Ochii, Yokohama, Japan

[73] Assignee: Kabushiki Kaisha Toshiba, Kawasaki, Japan

[*] Notice: The term of this patent shall not extend beyond the expiration date of Pat. No. 5,563,434.

[21] Appl. No.: 694,668

[22] Filed: Aug. 9, 1996

Related U.S. Application Data

[62] Division of Ser. No. 468,385, Jun. 6, 1995, Pat. No. 5,563,434, which is a continuation of Ser. No. 320,777, Oct. 11, 1994, abandoned, which is a continuation of Ser. No. 160,287, Dec. 2, 1993, abandoned, which is a continuation of Ser. No. 704,924, May 23, 1991, abandoned.

[30] Foreign Application Priority Data

May 24, 1990 [JP] Japan ................................ 2-134938

[51] Int. Cl.$^6$ .................. H01L 29/92; G11C 11/401; G11C 11/409
[52] U.S. Cl. .................. 257/306; 257/313; 365/149
[58] Field of Search .................. 257/306–310, 257/312, 313; 365/149, 174

[56] References Cited

U.S. PATENT DOCUMENTS

| | | | |
|---|---|---|---|
| 4,584,670 | 4/1986 | Michael | 365/149 |
| 4,786,954 | 11/1988 | Morie et al. | 365/149 |
| 4,799,193 | 1/1989 | Horiguchi et al. | 365/149 |
| 4,845,673 | 7/1989 | Chevalier | 365/149 |
| 4,849,801 | 7/1989 | Honjyo et al. | 365/154 |
| 4,855,801 | 8/1989 | Kuesters | 357/23.6 |
| 5,070,385 | 12/1991 | Evans, Jr. et al. | 365/145 |
| 5,214,304 | 5/1993 | Ema et al. | 257/306 |
| 5,563,434 | 10/1996 | Ochii | 257/306 |

FOREIGN PATENT DOCUMENTS

| | | | |
|---|---|---|---|
| 0001155 | 1/1990 | Japan | 257/307 |
| 0066967 | 3/1990 | Japan | 365/149 |
| 0329569 | 8/1989 | WIPO | 257/307 |

OTHER PUBLICATIONS

M. Aoki et al., "A 1.5-V Dram for Battery-Based Applications", Oct. 1989, pp. 1206–1212, IEEE Journal of Solid-State Circuits, vol. 24, No. 5.

*Primary Examiner*—Peter Toby Brown
*Attorney, Agent, or Firm*—Finnegan, Henderson, Farabow, Garrett & Dunner, L.L.P.

[57] ABSTRACT

The gate of a selection transistor is connected to a word line and the source thereof is connected to a bit line. The drain of the selection transistor is connected to a storage node constituting a capacitor of thin film transistor structure. The capacitor has a plate electrode insulated from the storage node, that portion of the plate electrode which is disposed in opposition to the storage node is formed to have an impurity concentration lower than the remaining portion thereof and an inverted layer is formed in the corresponding portion according to data stored in the storage node. The plate electrode is connected to pulse generation means, a pulse signal is output from the pulse generation means in the data readout operation and the potential of the plate electrode is raised by the pulse signal.

10 Claims, 9 Drawing Sheets

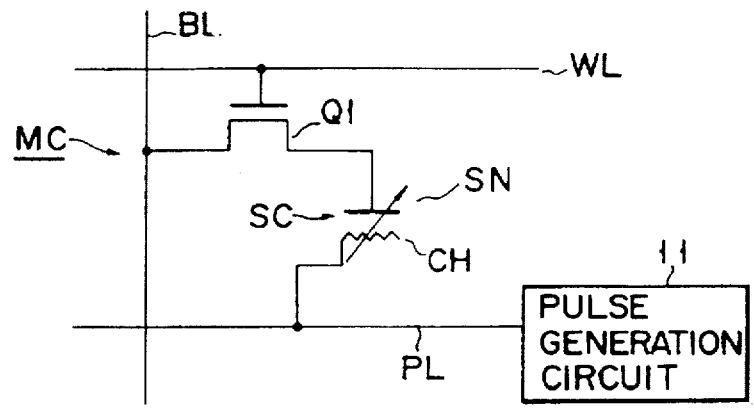
F I G. 1
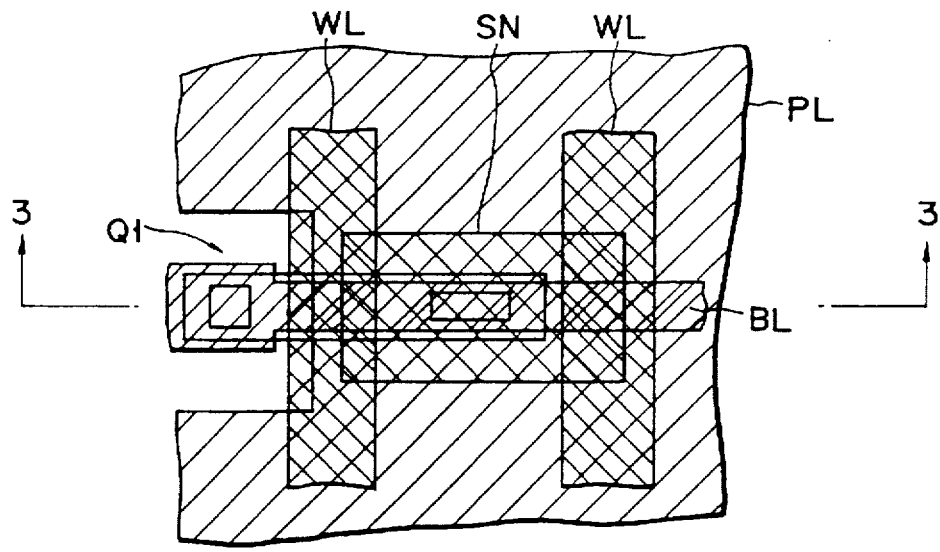
F I G. 2
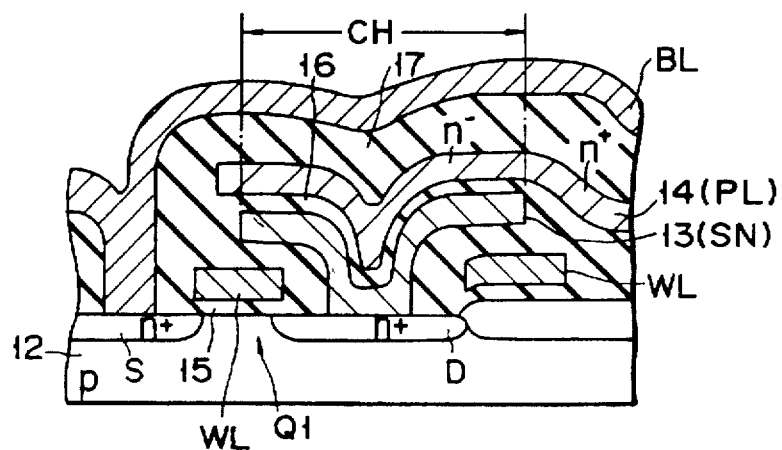
F I G. 3

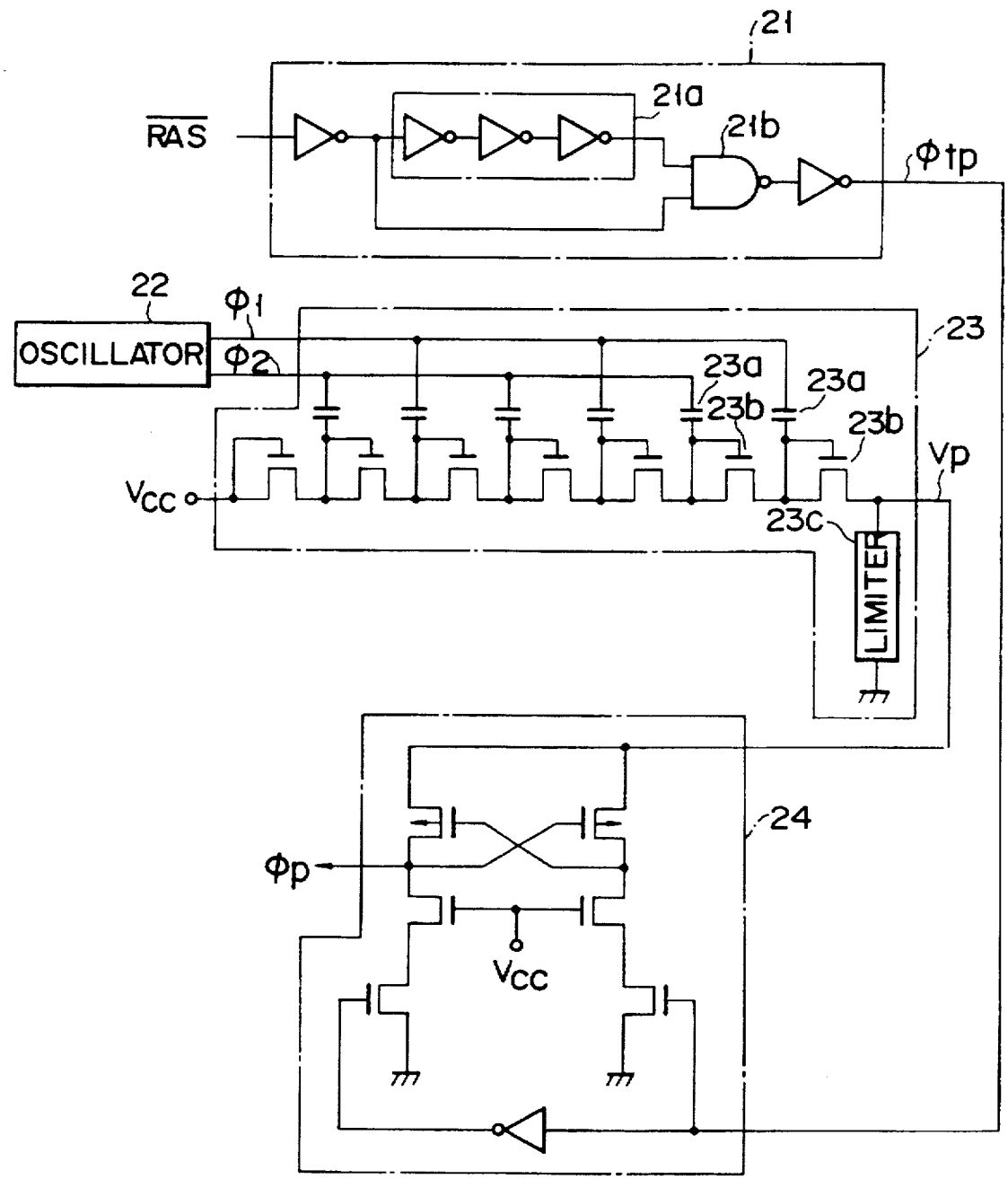
F I G. 5

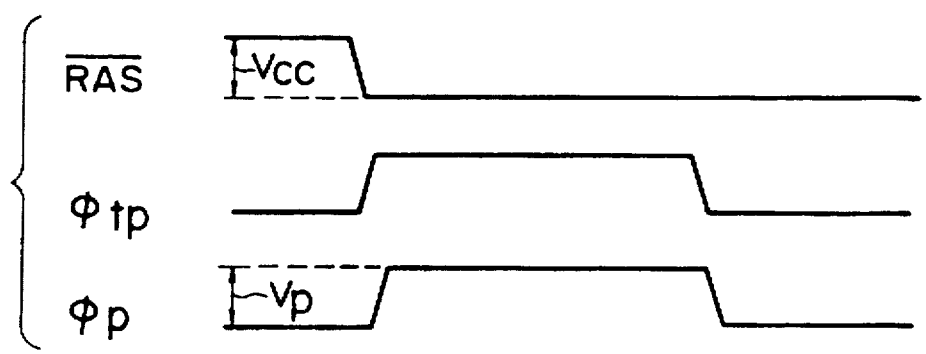
F I G. 6A
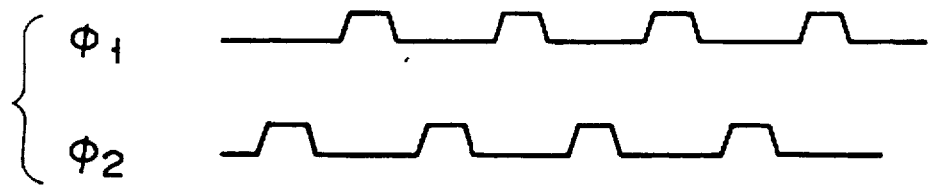
F I G. 6B

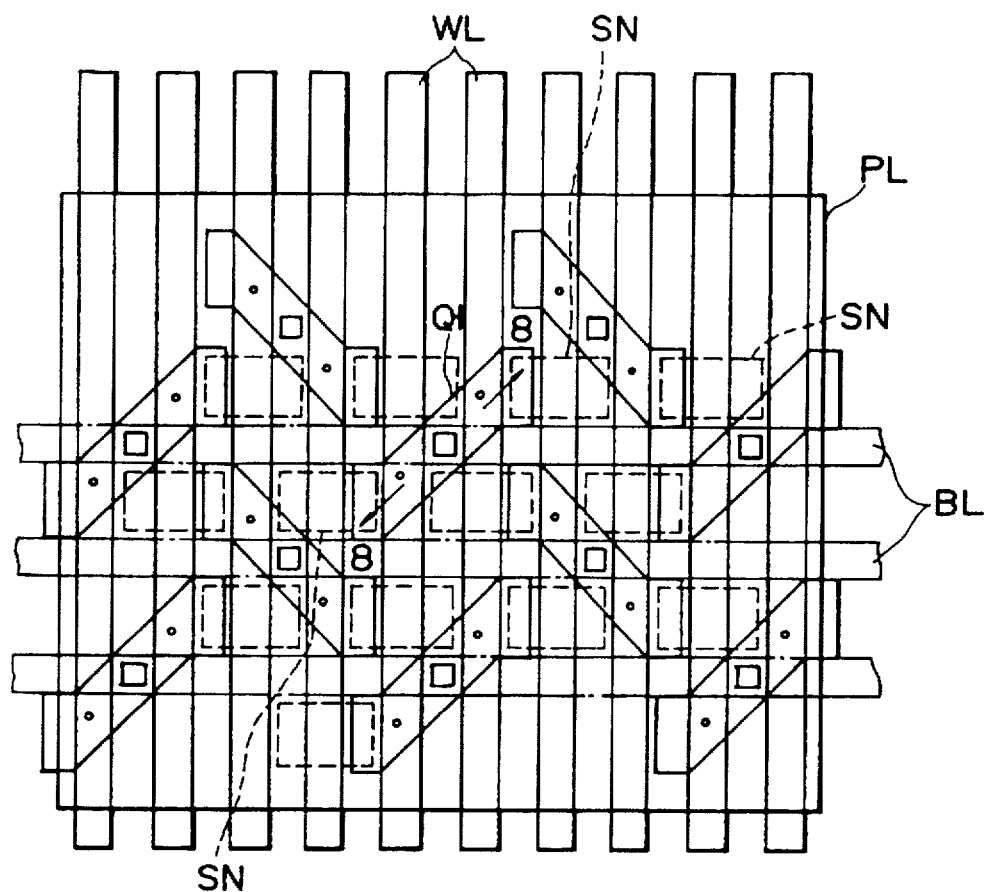
F I G. 7
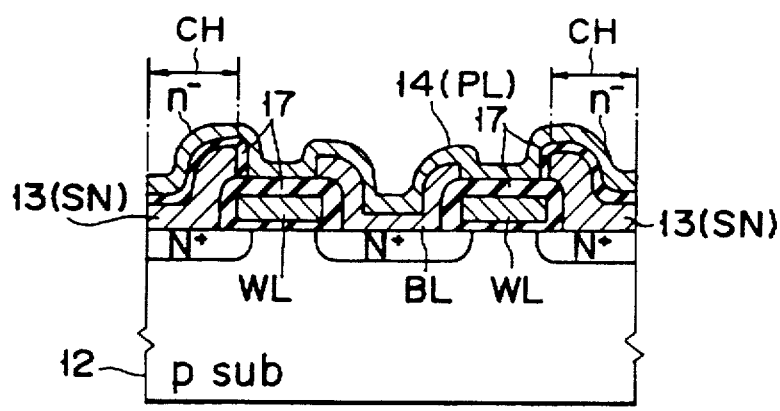
F I G. 8

5,796,137

SEMICONDUCTOR MEMORY DEVICE HAVING CAPACITOR OF THIN FILM TRANSISTOR STRUCTURE

This is a division of application Ser. No. 08/468,385 filed Jun. 6, 1995, now U.S. Pat. No. 5,563,434, which is a continuation of application Ser. No. 08/320,777 filed Oct. 11, 1994, which is a continuation of application Ser. No. 08/160,287 filed Dec. 2, 1993, which is a continuation of application Ser. No. 07/704,924 filed May 23, 1991, the latter three now abandoned.

BACKGROUND OF THE INVENTION

1. Field of the Invention

This invention relates to a semiconductor memory device, for example, a memory cell of a DRAM (Dynamic Random Access Memory).

2. Description of the Related Art

FIG. 10 shows an equivalent circuit of a memory cell of a DRAM having a conventional stacked capacitor structure. The memory cell includes a selection transistor Q1 and a data storing capacitor $C_S$. The gate of the selection transistor Q1 is connected to a word line WL, and one end of the current path of the selection transistor Q1 is connected to a bit line BL and the other end of the current path thereof is connected to the capacitor $C_S$.

FIGS. 11 and 12 show the structure of the above memory cell and portions which are the same as those of FIG. 10 are denoted by the same reference numerals.

In FIGS. 11 and 12, a pair of polysilicon layers 31 and 32 constituting the capacitor $C_S$ are formed above a diffusion layer $n^+$ of the selection transistor Q1. That is, the polysilicon layer 31 is formed in valid contact with the diffusion layer $n^+$ of the selection transistor Q1 and the polysilicon layer 32 serving as a plate electrode which is formed above the polysilicon layer 31 with an insulation film disposed therebetween is biased to a preset potential. The pair of polysilicon layers 31 and 32 are formed to extend over the word line WL partly acting as the gate electrode of the selection transistor Q1 to increase the storage capacity.

In the DRAM, the number of memory cells connected to the bit line increases and the capacitance associated with the bit line tends to increase with formation of the memory cell of even greater miniaturization. Further, as the miniaturization processing technique has been developed, the occupied area of each cell is reduced. Therefore, the technique for making the insulation film of the capacitor thinner is required to obtain the memory capacitance $C_S$ of a desired value. However, there is a limitation on the technique of reducing the film thickness of the insulation film since it is necessary to maintain the reliability of the capacitor, for example. Therefore, it becomes difficult to attain a desired value of a so-called $C_B/C_S$ ratio which is the ratio of the capacitance $C_B$ of the bit line to the memory capacitance $C_S$ of the cell.

Further, in the LSI of the extremely fine pattern processing generation in the future, it is considered that the power source voltage will be made lower than 5 V. When the power source voltage of the DRAM is lowered, the amount of charges stored in the capacitor is reduced so that the amount of charges transferred to the bit line in the data readout operation will become small. Therefore, it is considered difficult to correctly amplify data by use of a sense amplifier.

Now, the relation between the capacitance $C_B$ of the bit line and the memory capacitance $C_S$ of the cell is explained.

FIG. 13 shows a conventional DRAM including a peripheral circuit and FIG. 14 illustrates the operation of the circuit shown in FIG. 13. The bit line potential $V_{BL}$ is an initial preset potential of the bit line before the readout operation.

First, the readout operation is explained.

(1) Since the equalizing signal EQL is set at a high level before the active cycle is started, the bit lines BL0 to BL3 are precharged to a potential of $V_{BL}$ level.

(2) A word line WL0 is selected by a row decoder (not shown) and the potential of the word line WL0 is raised to 7.5 V which is higher than Vcc (=5 V) by means of a bootstrap circuit (not shown).

(3) A dummy word line DWL0 and /DWL0 (/ indicates an inverted form) corresponding to the selected word line are selected, and the potential of the dummy word line DWL0 is set from the $V_{BL}$ level to the Vcc level and the potential of the dummy word line /DWL0 is set from the $V_{BL}$ to the Vss level.

(4) Data "1" stored in the selected cell connected to the bit line BL0 and data "0" stored in the selected cell connected to the bit line BL2 are respectively transferred to the bit lines BL0 and BL2. Assuming that the storage level of data "1" in the memory cell is $V_1$ and the storage level of data "0" is $V_0$, then the potential level $v_1$ of the bit line after the readout of data "1" can be expressed by the following equation (1):

$$v_1 = (V_1 + C_B/C_S \cdot V_{BL})/(1 + C_B/C_S) \tag{1}$$

Also, the potential level $v_0$ of the bit line after the readout of data "0" can be expressed by the following equation (2):

$$v_0 = (V_0 + C_B/C_S \cdot V_{BL})/(1 + C_B/C_S) \tag{2}$$

If $V_1 = 5$ V, $V_0 = 0$ V, $V_{BL} = 2.5$ V, and $C_B/C_S = 15$, then $v_1 = 2.656$ V and $v_0 = 2.344$ V. Since the reference level of the bit lines BL1 and BL3 is $V_{BL} = 2.5$ V, the potential difference $\Delta v$ amplified by the sense amplifier becomes equal to $\Delta v_1 = 0.156$ V at the readout time of data "1" and becomes equal to $\Delta v_0 = 0.156$ V at the readout time of data "0", and thus the potential difference is set to the same value at the readout time of data "1" and "0".

(5) The sense amplifier is activated, the potentials of the bit lines BL0 and BL3 are amplified to the Vcc level, and the potentials of the bit lines BL1 and BL2 are amplified to the Vss level.

(6) The potentials of a pair of bit lines BL0 and BL1 or bit lines BL2 and BL3 selected by a selection signal supplied from a column decoder (not shown) to a column selection line CSL are respectively supplied to output lines DQ and /DQ.

Next, the write-in operation is explained. In the write-in operation, the same steps (1) to (3) as described in the readout operation are effected. After this, in the step (4), write-in potentials supplied to the output lines DQ and /DQ are transferred to the sense amplifier via a column switching transistor selected by means of the column selection line CSL. The potentials of the pair of bit lines are set to the Vcc and Vss levels by means of the sense amplifier and data corresponding to the thus set levels is written into a selected memory cell.

In this case, the equations (1) and (2) can be rewritten as follows.

$$v_1 = V_{BL} + (V_1 - V_{BL})/(1 + C_B/C_S) \tag{3}$$

$$v_0 = V_{BL} + (V_0 - V_{BL})/(1 + C_B/C_S) \tag{4}$$

As is clearly seen from the equations (3) and (4), $v_1$ and $v_0$ become nearer to $V_{BL}$ when the capacitance $C_B$ of the bit line increases and the capacitance $C_S$ of the capacitor decreases with an increase in the memory capacitance and with formation of the memory cell of even greater miniaturization.

Since an amplification reference voltage of the sense amplifier is $V_{BL}$, the potential differences $\Delta v_1$ and $\Delta v_0$ amplified by the sense amplifier are both lowered. Therefore, it becomes difficult to correctly amplify data by use of the sense amplifier.

SUMMARY OF THE INVENTION

An object of this invention is to provide a semiconductor memory device capable of maintaining a desired ratio of the capacitance $C_B$ of a bit line to the memory capacitance $C_S$ of a cell even when the memory capacitance is increased, the memory cell is extremely miniaturized and the operation voltage is lowered.

The above object can be attained by a semiconductor memory device comprising:

a selection transistor having a gate connected to a word line and a current path connected at one end to a bit line;

a capacitor having a storage node connected to the other end of the current path of the selection transistor and a plate electrode insulated from the storage node, an inverted layer being formed in that portion of the plate electrode which is disposed in opposition to the storage node according to data stored in the storage node; and pulse generation means connected to the plate electrode, for supplying a pulse signal to the plate electrode.

With the above construction, since no inverted layer is formed in a channel region which is formed in the plate electrode in a case where data "0" is stored in the storage node of the capacitor, the resistance of the channel region is high, and in a case where data "1" is stored in the storage node of the capacitor, an inverted layer is formed in the channel region and the resistance of the channel region is low. If, in this condition, the potential of the plate electrode is raised by a pulse signal output from the pulse generation means in the data readout operation, the potential of the channel region of a cell storing data "1" is set to a high level more rapidly than that of the channel region of a cell storing data "0". Therefore, the potential of the storage node capacitively coupled with the channel region is also set to a high level. When the selection transistor of the cell in which data "1" is stored is selected, transfer charges amplified according to the potential raised as described above are supplied to the bit line. As a result, the amount of transfer charges supplied to the bit line is increased, thus increasing variation in the potential of the bit line. Therefore, amplification by the sense amplifier can be easily effected.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the preferred embodiment of the invention.

FIG. 1 is an equivalent circuit diagram showing one embodiment of this invention;

FIG. 2 is a plan view showing the cell construction of FIG. 1;

FIG. 3 is a cross sectional view taken along the line 3—3 of FIG. 2;

FIG. 5 is a circuit diagram showing an example of the circuit construction of a pulse generation circuit shown in FIG. 1;

FIGS. 6A and 6B are waveform diagrams for illustrating the operation of the circuit shown in FIG. 5;

FIG. 7 is a plan view showing the cell structure according to a second embodiment of this invention;

FIG. 8 is a cross sectional view taken along the line 8—8 of FIG. 7;

DETAILED DESCRIPTION OF THE PREFERRED EMBODIMENTS

Figure 10:
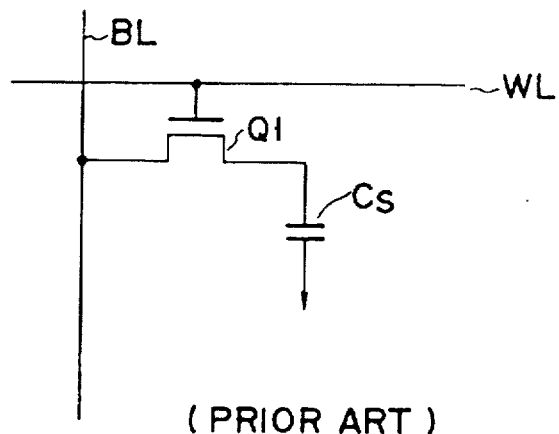
FIG. 10 is an equivalent circuit showing a memory cell of a conventional DRAM.
Figure 11:
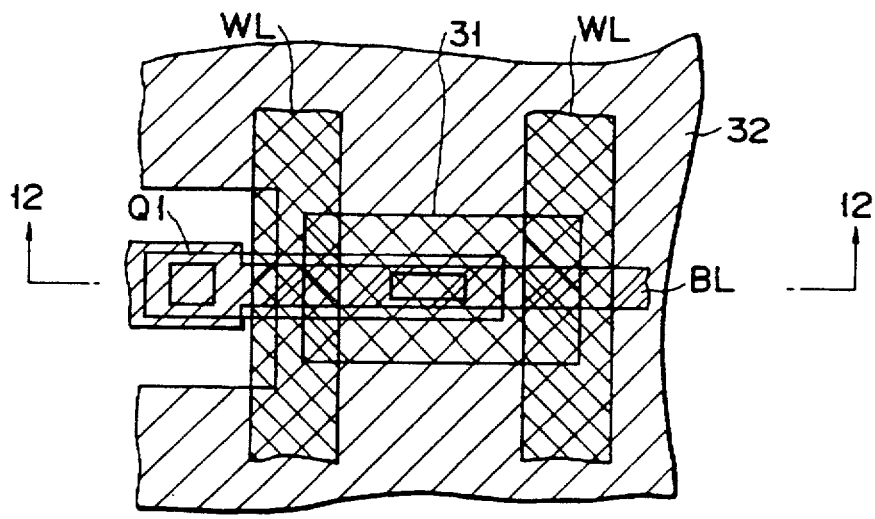
FIG. 11 is a plan view showing the construction of a memory cell shown in FIG. 10.
Figure 12:
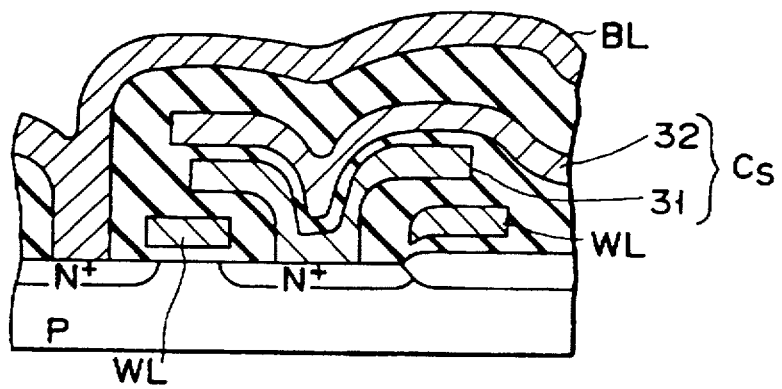
FIG. 12 is a cross sectional view taken along the line 12—12 of FIG. 11.
Figure 13:
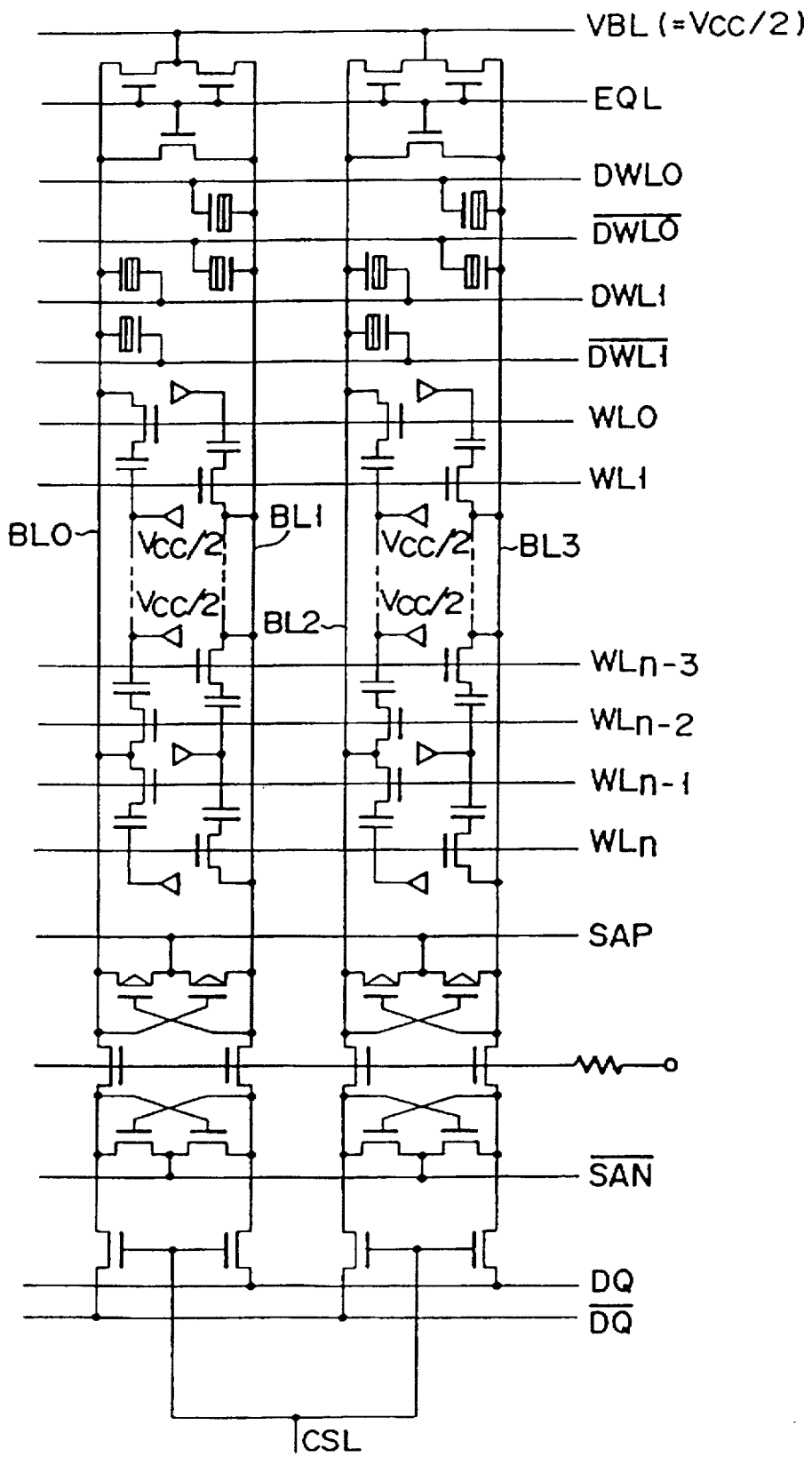
FIG. 13 is a circuit diagram showing a DRAM including a peripheral circuit.
Figure 14:
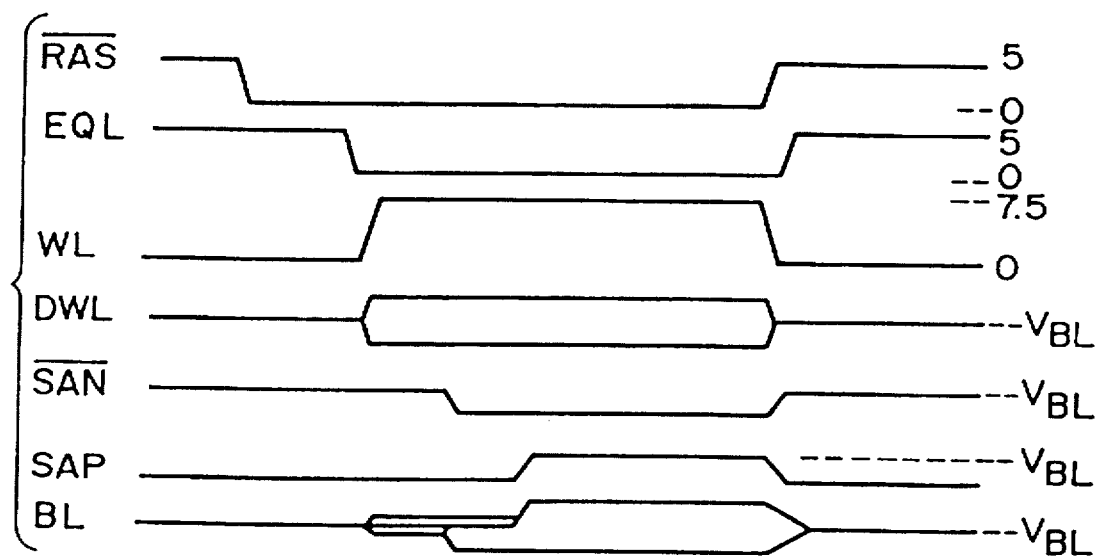
FIG. 14 is a waveform diagram for illustrating the operation of the circuit of FIG. 13.

There will now be described an embodiment of this invention with reference to the accompanying drawings. Portions which are the same as those of FIG. 10 are denoted by the same reference numerals and only different portions are explained.

FIG. 1 shows an equivalent circuit of a circuit according to a preferred embodiment of this invention and shows one memory cell MC.

For example, the gate of an n-channel selection transistor Q1 is connected to a word line WL and the source of the selection transistor Q1 is connected to a bit line BL. The drain of the selection transistor Q1 is connected to a plate electrode PL via a capacitor (which is hereinafter referred to as a switched capacitor SC) whose state is changed according to stored data. The switched capacitor SC is constructed by a storage node SN connected to the drain of the selection transistor Q1 and a channel region CH connected to the plate electrode PL and formed above the storage node with an insulation film (not shown) disposed therebetween. The storage node SN is formed of a polysilicon film, for example, and the channel region CH is formed of a polysilicon film integrally with the plate electrode PL, for example. The channel region CH is formed with an impurity concentration lower than that of the plate electrode PL.

The plate electrode PL is connected to a pulse generation circuit 11. The pulse generation circuit 11 outputs a pulse signal for raising the potential of the plate electrode PL in the data readout operation.

FIGS. 2 and 3 show the construction of the above memory cell MC.

The switched capacitor SC is formed on a diffused layer of the selection transistor Q1. That is, diffused layers $n^+$ constituting the source S and drain D of the n-channel transistor Q1 are formed in a p-type semiconductor substrate 12. An oxide film 15 is formed on the substrate 12 and a gate serving as the word line WL is formed on the oxide film 15.

A polysilicon film 13 constituting the storage node SN is formed on the drain D of the transistor Q1. An insulation film 16 is formed on the polysilicon film 13 and a thin polysilicon film 14, for example, is formed on the insulation film 13. The area of the thin polysilicon film 14 is made larger than that of the polysilicon film 13. That portion of the thin polysilicon film 14 which overlaps the polysilicon film 13 is formed to have a low impurity concentration (n⁻) to create a channel region CH and the remaining portion thereof is formed as a high impurity concentration region of low resistance so as to constitute the plate electrode PL. An insulation film 17 is formed on the thin polysilicon film 14 and the bit line BL is formed on the insulation film 17. The bit line BL is connected to the source S.

Assuming that the storage node SN is a gate and the plate electrode PL is a drain, the switched capacitor SC does not constitute a transistor structure since it has no source, but in this specification, the structure is referred to as a thin film transistor (TFT).

Figure 4:
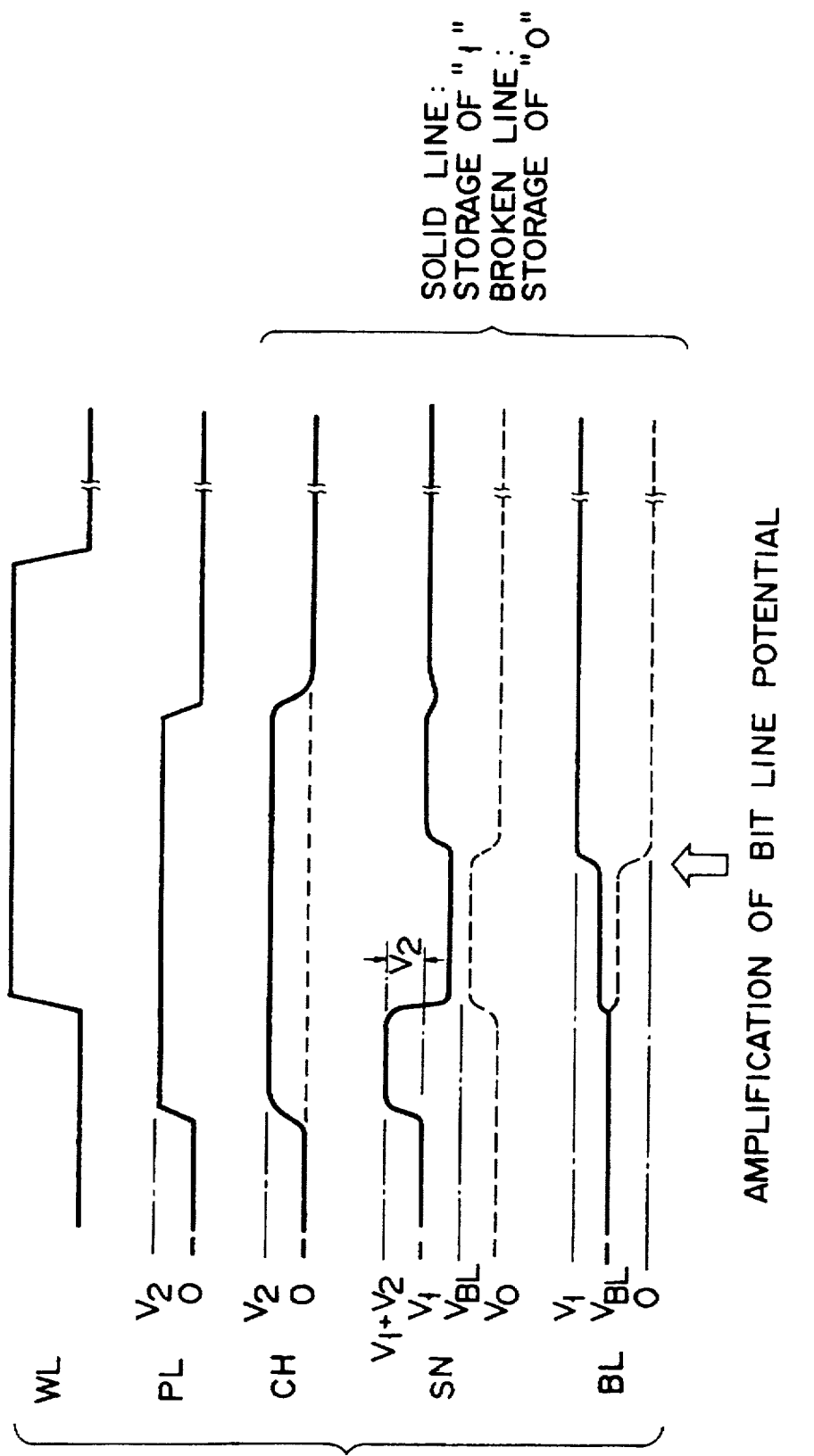
FIG. 4 is a diagram for illustrating the operation of the circuit shown in FIGS. 1 to 3.

The operation principle of the circuit with the above construction is explained below by referring to FIG. 4. In the switched capacitor SC, an inverted layer is not formed in the channel region CH when data "0" is stored in the storage node SN, and an inverted layer is formed in the channel region CH when data "1" is stored in the storage node. Therefore, the channel region CH is set to the same potential level as the plate electrode PL when data "1" is stored.

In a case where data stored in the memory cell is read out, a plate pulse φp is output from the pulse generation circuit 11 before the word line WL is selected, and the potential of the plate electrode PL is raised from 0 V to $V_2$, for example, ½ Vcc which is higher than 0 V. At this time, if data "0" is stored in the storage node SN, an inverted layer is not formed in the channel region CH. Therefore, the channel region CH is set in the high resistance state and the channel region CH is kept at 0 V even when the potential of the plate electrode PL is raised. As a result, the potential of the storage node SN capacitively coupled with the channel region CH is maintained at 0 V.

Further, if data "1" is stored in the storage node SN, an inverted layer is formed in the channel region so that the potential of the channel region CH may be set to a high potential level when the potential of the plate electrode PL is raised. Therefore, the potential of the storage node SN capacitively coupled with the channel region CH is raised to a high potential level.

Next, when the word line WL is selected, the charge of the storage node SN is transferred to the bit line BL and thus stored data is read out on the bit line BL. The readout potential of the bit line BL is amplified by a sense amplifier (not shown) and at the same time, data "1" is written into the storage node SN via the bit line.

Next, the potential of the plate electrode PL is returned to 0 V before selection of the word line WL is completed. When data "1" is stored in the storage node SN, an inverted layer is formed in the channel region CH so that the channel region CH may be set in the low resistance state and the potential of the channel region CH will be returned to 0 V. When data "0" is stored in the storage node SN, an inverted layer is not formed so that the channel region CH may be set in the high resistance state and kept at 0 V even when a pulse of positive potential is applied to the plate electrode PL.

Since charges are supplied from the bit line to the capacitor of the memory cell storing data "1" when the plate electrode PL is returned to 0 V, the "1" level of the memory cell is kept at the same potential as the bit line.

In this case, if the amount of charges transferred to the bit line BL is derived in the same manner as in the conventional case, the potential level $v_1$ of the bit line after the "1" readout operation and the potential level $v_0$ of the bit line after the "0" readout operation are expressed by the following equations (5) and (6):

$$v_1 = (V_1 + V_2 + C_B/C_S \cdot V_{BL})/(1 + C_B/C_S) \quad (5)$$
$$= (V_1 + V_2 - V_{BL})/(1 + C_B/C_S) + V_{BL}$$

$$v_0 = (V_0 + C_B/C_S \cdot V_{BL})/(1 + C_B/C_S) \quad (6)$$
$$= (V_0 - V_{BL})/(1 + C_B/C_S) + V_{BL}$$

By comparing the equations (5) and (6) with the equations (3) and (4) indicating the conventional case, it is understood that the level of $v_1$ is raised by $V_2/(1+C_B/C_S)$. That is, the readout amount of the bit line is increased by the corresponding amount at the readout time, thus enhancing the operation margin.

FIG. 5 shows an example of the pulse generation circuit 11 and FIGS. 6A and 6B show signals at respective circuit points. The pulse generation circuit 11 raises the potential of the plate electrode prior to selection of the selection transistor when stored data is read out and lowers the potential of the plate electrode before the selection of the selection transistor is completed.

That is, the pulse generation circuit 11 includes a timing pulse generation circuit 21 for generating a pulse signal φtp for a preset period of time in response to a fall of a RAS (Row Address Strobe), a booster circuit 23 for raising a power source voltage Vcc to a preset voltage Vp in response to pulse signals φ₁ and φ₂ having a phase difference of 90° output from an oscillator 22, and an output circuit 24 for outputting a voltage Vp output from the booster circuit 22 as a plate pulse φp in response to a pulse signal φtp output from the timing pulse generation circuit 21.

The timing pulse generation circuit 21 includes a delay circuit 21a and a NAND circuit 21b and generates a pulse signal φtp in response to a fall of the RAS. That is, when the RAS is at a high level, an output of the timing generation circuit 21 is kept at a low level. When the RAS is set to a low level, the timing pulse generation circuit 21 generates a timing pulse signal φtp of high level. The pulse signal φtp has a width corresponding to the delay time determined by the delay circuit 21a.

The oscillation circuit 22 generates the pulse signals φ₁ and φ₂ having a phase difference of 90° and the pulse signals φ₁ and φ₂ are supplied to capacitors constituting the booster circuit 23.

The booster circuit 23 is constituted by a plurality of capacitors 23a, a plurality of transistors 23b connected in a diode fashion, and a limiter 23c, and raises the power source voltage Vcc by use of the capacitors 23a and transistors 23b and creates the preset voltage Vp by means of the limiter 23c in response to the pulse signals φ₁ and φ₂.

The output circuit 24 outputs the voltage Vp supplied from the booster circuit 23 as the plate pulse φp in response to the pulse signal φtp output from the timing pulse generation circuit 21. That is, since the pulse signal φtp is set at a low level when the RAS is at a high level, the output circuit 24 will not select the output of the booster circuit 23 and the plate pulse φp is set at the low level. When the RAS is set to the low level, the pulse signal φtp is set to the high level so that the output of the booster circuit 23 may be selected by the output circuit 24, thereby outputting the voltage Vp as the plate pulse φp. The pulse width of the pulse φp is determined by the delay time set in the timing pulse generation circuit 21.

According to the above embodiment, the switched capacitor SC having the FET structure is connected to the selection transistor Q1 so as to permit an inverted layer to be formed in the channel region CH of the switched capacitor SC according to stored data. Further, in the data readout operation, the potential of the plate electrode PL of the switched capacitor SC is raised. Therefore, the potential of the storage node SN in which data "1" is stored is raised according to increase in the potential of the plate electrode PL, and when the selection transistor Q1 is selected, transfer charges amplified by the degree of raised potential are supplied to the bit line BL so that amplification by the sense amplifier can be easily effected.

Further, since the potential of the plate electrode PL is raised to increase the amount of transfer charges to the bit line BL in the data readout operation, the memory capacitance $C_S$ of the cell can be substantially increased. Therefore, when the DRAM is formed with a larger memory capacity in an extremely fine pattern and when the power source voltage is set to be lower than 5 V, a desired value of the ratio $C_B/C_S$ of the bit line capacitance $C_B$ to the memory capacitance $C_S$ of the cell can be obtained.

Further, the pulse generation circuit 11 raises the potential of the plate electrode for a short period of time in the data readout operation and does not always raise the same unlike the conventional case. (IEEE JOURNAL OF SOLID-STATE CIRCUITS, VOL. 24, No. 5, OCTOBER 1989, "A 1.5-V DRAM for Battery-Based Application"). Therefore, deterioration of the gate oxide film can be prevented and the reliability of the device can be enhanced.

Next, the second embodiment of this invention is explained with reference to FIGS. 7 and 8. Portions which are the same as those of FIGS. 2 and 3 are denoted by the same reference numerals and only different portions are explained here.

In the memory cell of the above embodiment, the bit line is positioned on the top portion of the device, but in this embodiment, a memory cell is formed with a bit line buried structure in which the bit line is buried in the other wiring layer.

That is, as shown in FIGS. 7 and 8, storage nodes SN formed of polysilicon films 13 are disposed on one-side layers of the diffused layers of selection transistors Q1 and bit lines BL are disposed on the other diffused layers. Insulation films 17 are formed on the storage nodes SN and the gates and a plate electrode PL formed of a polysilicon film 14 is disposed on the insulation films 17 and bit lines BL. Portions of the plate electrode PL which overlap the storage nodes SN are formed with a low impurity concentration (n⁻) so as to form channel regions CH.

With the above construction, the same effect as that obtained in the former embodiment can be attained.

In the above embodiments, the switched capacitor SC is formed by use of the thin film technique, but it may be formed by the epitaxial growth technique.

Further, the switched capacitor SC is formed of polysilicon, but it may be formed of amorphous silicon.

In addition, the switched capacitor SC is formed of a thin film, but it is not necessary to use a thin film if it is formed of single crystal silicon.

Further, in the above embodiment, the switched capacitor SC is formed with the stacked structure, but this invention is not limited to this, and it may be formed with a trench structure, or with a combination thereof.

When the switched capacitor SC is formed of a normal MOS capacitor, it is possible to attain a desired value of the ratio of the bit line capacitance $C_B$ to the storage capacitance $C_S$ of the cell.

Figure 9:
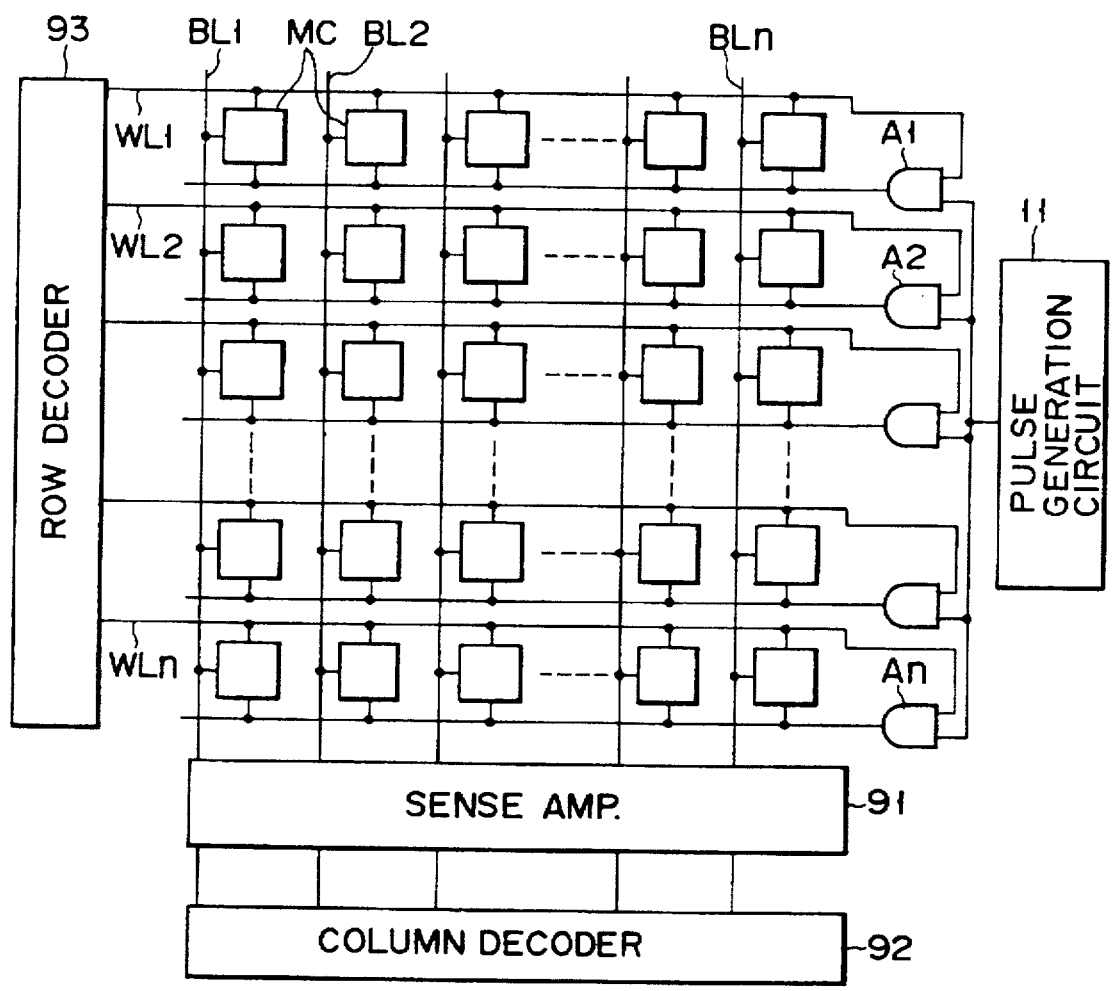
FIG. 9 is a circuit diagram showing the circuit construction according to a third embodiment of this invention.

FIG. 9 shows a third embodiment of this invention and portions which are the same as those of FIG. 1 are denoted by the same reference numerals.

As shown in FIG. 9, memory cells MC are arranged in a matrix form. One-side ends of bit lines BL1 to BLn are connected to a column decoder 92 via a sense amplifier 91. One-side ends of word lines WL1 to WLn are connected to a row decoder 93. The memory cells MC are selected by the column decoder 92 and row decoder 93 and data read out from the memory cell MC is supplied to the sense amplifier 91.

The other side ends of the word lines WL1 to WLn are connected to one-side input terminals of AND circuits A1 to An. The other input terminals of the AND circuits A1 to An are connected to a pulse generation circuit 11. The output terminals of the AND circuits A1 to An are connected to plate electrodes PL1 to PLn.

With the above construction, the AND circuits A1 to An permit pulse signals output from the pulse generation circuit 11 to be supplied to the plate electrodes only when they are enabled by the word lines. Therefore, the pulse generation circuit 11 is only required to drive the memory cells on the row selected by the word line so that the driving ability of the pulse generation circuit 11 can be made small.

This invention is not limited to the above embodiments and can be variously modified without departing from the technical scope thereof.

What is claimed is:

1. A semiconductor memory device having a word line and a bit line, the semiconductor memory device comprising:

a selection transistor having a gate coupled to the word line and a current path having a first end coupled to the bit line, and a second end;

a capacitor having a storage node coupled to the second end of the current path and a plate electrode insulated from said storage node, a portion of said plate electrode in opposition to the storage node having an impurity concentration lower than a remaining portion thereof and serving as a channel region, the plate electrode having no direct electrical connection with the second end;

pulse generation means for supplying a pulse to said plate electrode; and means, operative during an occurrence of the pulse, for enabling the word line.

2. A device according to claim 1, wherein said capacitor includes a thin film structure in which said storage node serves as a gate electrode.

3. A device according to claim 2, wherein said storage node and plate electrode include polysilicon.

4. A device according to claim 2, wherein said storage node and plate electrode include amorphous silicon.

5. A device according to claim 2, wherein said storage node and plate electrode include single crystal silicon.

6. A device according to claim 1, wherein said pulse generation means includes an oscillation circuit for generating the pulse; a booster circuit for raising the pulse generated from said oscillation circuit to a preset potential;

and a supply circuit for supplying the preset potential pulse output from said booster circuit to said plate electrode before selection of said selection transistor in a readout operation and interrupting supply of the pulse to said plate electrode before selection of said selection transistor is terminated.

7. A semiconductor memory device having a word line and a bit line, the semiconductor memory device comprising:

- a selection transistor having a gate coupled to the word line and a current path having a first end coupled the bit line, and a second end;
- a capacitor having a storage node coupled to the second end of the current path and a plate electrode insulated from said storage node, a portion of said plate electrode in opposition to said storage node having an impurity concentration lower than a remaining portion thereof and serving as a channel region, the plate electrode having no direct electrical connection with the second end;
- selection signal creation means for creating a selection signal for selecting said word line; and
- supplying means for supplying a pulse signal to said plate electrode.

8. A device according to claim 7, wherein said supplying means includes an AND circuit.

9. A semiconductor memory device having a word line and a bit line, the semiconductor memory device comprising:

- a selection transistor having a gate coupled to the word line and a current path having a first end coupled the bit line, and a second end;
- a capacitor having a node for storing data, coupled to the second end of the current path, and a plate electrode insulated from said storage node, a portion of said plate electrode being in opposition to said storage node and having a resistance that differs from that of the remainder of said plate electrode and that changes in accordance with the data;
- means for creating a pulse signal;
- means for creating a selection signal for selecting said word line; and
- supplying means for supplying the pulse signal to said plate electrode.

10. A device according to claim 9, wherein said supplying means includes an AND circuit including

- a first input responsive to the pulse signal;
- a second input responsive to the selection signal; and an output.

* * * * *

UNITED STATES PATENT AND TRADEMARK OFFICE
CERTIFICATE OF CORRECTION

PATENT NO. : 5,796,137
DATED : August 18, 1998
INVENTOR(S) : Kiyofumi OCHII

It is certified that error appears in the above-indentified patent and that said Letters Patent is hereby corrected as shown below:

Claim 7, Col. 9, Line 10, after "coupled", insert --to--.

Claim 9, Col. 10, Line 5, after "coupled", insert --to--.

Signed and Sealed this

Twenty-first Day of September, 1999

Attest:

Q. TODD DICKINSON

*Attesting Officer*          *Acting Commissioner of Patents and Trademarks*